United States Patent
Rorison et al.

(10) Patent No.: US 6,628,068 B1
(45) Date of Patent: Sep. 30, 2003

(54) LUMINESCENT DEVICE AND A LIQUID CRYSTAL DEVICE INCORPORATING A LUMINESCENT DEVICE

(75) Inventors: Judy Megan Rorison, Cheltenham (GB); Harald Reinhart Bock, Bordeaux (FR); Michael John Towler, Oxford (GB); Michael Stuart Weaver, Oxford (GB); Andrew James Hudson, Oxfordshire (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/857,550

(22) PCT Filed: Dec. 13, 1999

(86) PCT No.: PCT/JP99/06999

§ 371 (c)(1),
(2), (4) Date: Dec. 18, 2001

(87) PCT Pub. No.: WO00/36881

PCT Pub. Date: Jun. 22, 2000

(30) Foreign Application Priority Data

Dec. 12, 1998 (GB) .............................................. 9827328

(51) Int. Cl.[7] .................................................. H01J 1/62
(52) U.S. Cl. ...................... 313/504; 313/506; 313/112; 349/69
(58) Field of Search ................................ 313/504, 506, 313/507, 501, 112; 349/69, 70, 71; 428/690

(56) References Cited

U.S. PATENT DOCUMENTS

| | | | | |
|---|---|---|---|---|
| 5,142,388 A | * | 8/1992 | Watanabe et al. | .............. 349/69 |
| 5,723,871 A | * | 3/1998 | Nakanishi et al. | ............. 257/11 |
| 5,748,271 A | * | 5/1998 | Hikmet et al. | ................. 349/69 |
| 5,831,375 A | * | 11/1998 | Benson, Jr. | .................. 313/110 |
| 6,232,714 B1 | * | 5/2001 | Shen et al. | .................. 313/506 |
| 6,243,151 B1 | * | 6/2001 | Nose et al. | .................... 349/70 |
| 6,285,422 B1 | * | 9/2001 | Maeda et al. | .................. 349/96 |
| 6,383,665 B1 | * | 5/2002 | Bao et al. | .................... 428/690 |
| 6,445,431 B2 | * | 9/2002 | Nose et al. | .................... 349/70 |
| 6,489,044 B1 | * | 12/2002 | Chen et al. | ................. 428/690 |

FOREIGN PATENT DOCUMENTS

| | | |
|---|---|---|
| EP | 0 712 024 | 11/1995 |
| EP | 0 786 820 | 1/1997 |
| GB | 788 479 | 10/1955 |
| WO | 9603015 | 2/1996 |
| WO | 97/07653 | 2/1997 |
| WO | 97/07654 | 2/1997 |
| WO | 98/35393 | 8/1998 |

* cited by examiner

Primary Examiner—Ross Gushi
(74) Attorney, Agent, or Firm—Renner, Otto, Boisselle & Sklar

(57) ABSTRACT

A luminescent device having first and second light-emitting regions, wherein the first light-emitting region emits, in use, a first polarised light and the second light-emitting region emits, in use, a second polarised light different from the first polarised light.

25 Claims, 12 Drawing Sheets

FIG.2
*PRIOR ART*
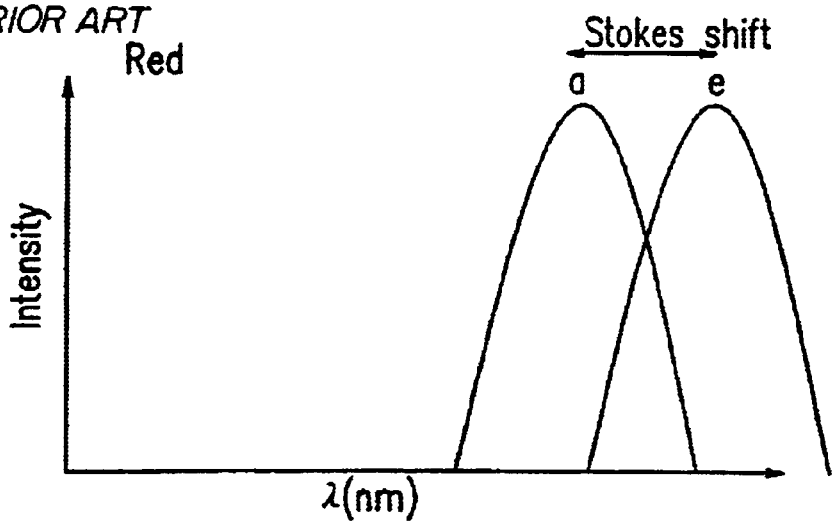
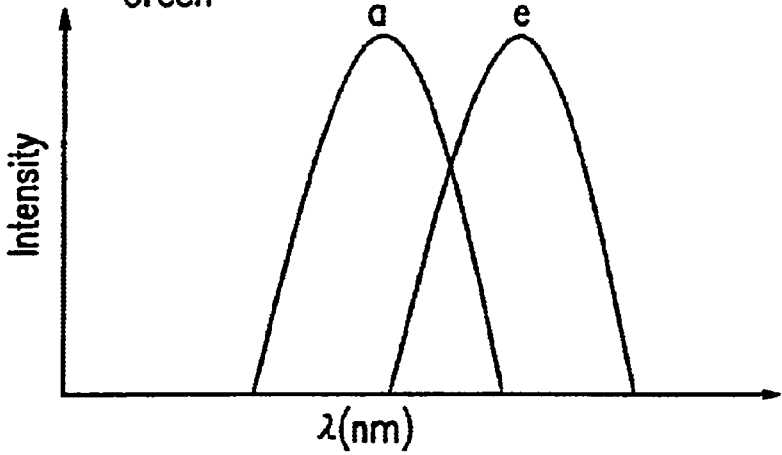
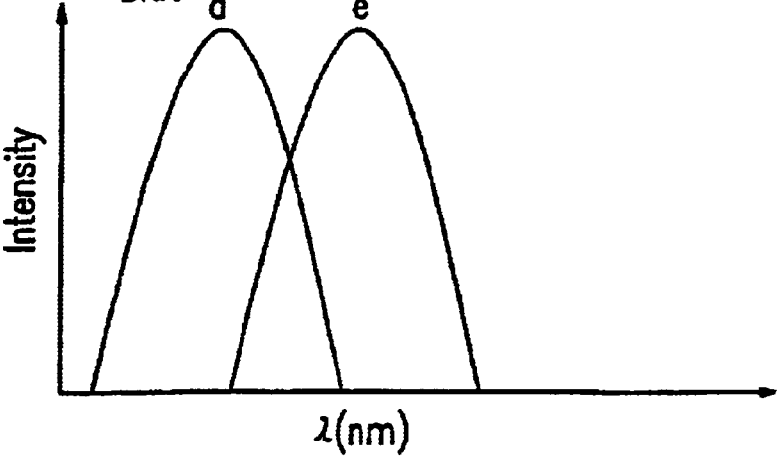

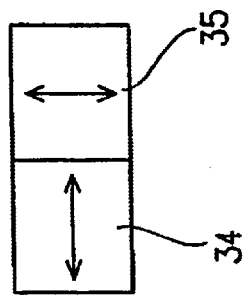
FIG.6a
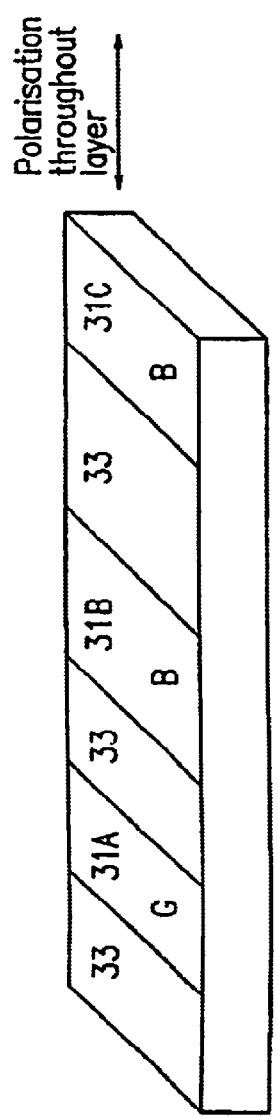
FIG.6b
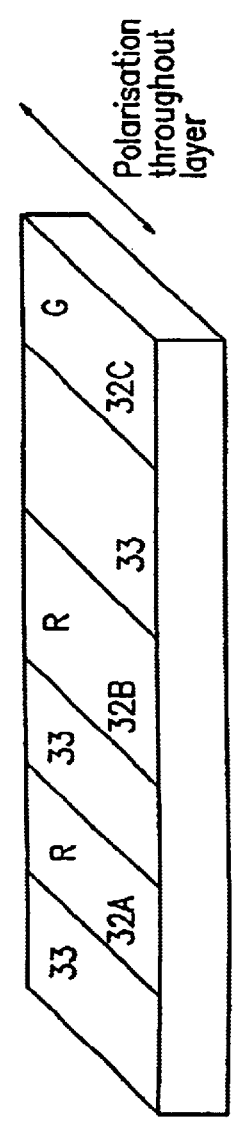

Obliquely evaporate inorganic alignment layer

Evaporate emitter layer

Obliquely evaporate inorganic alignment layer

Evaporate emitter layer

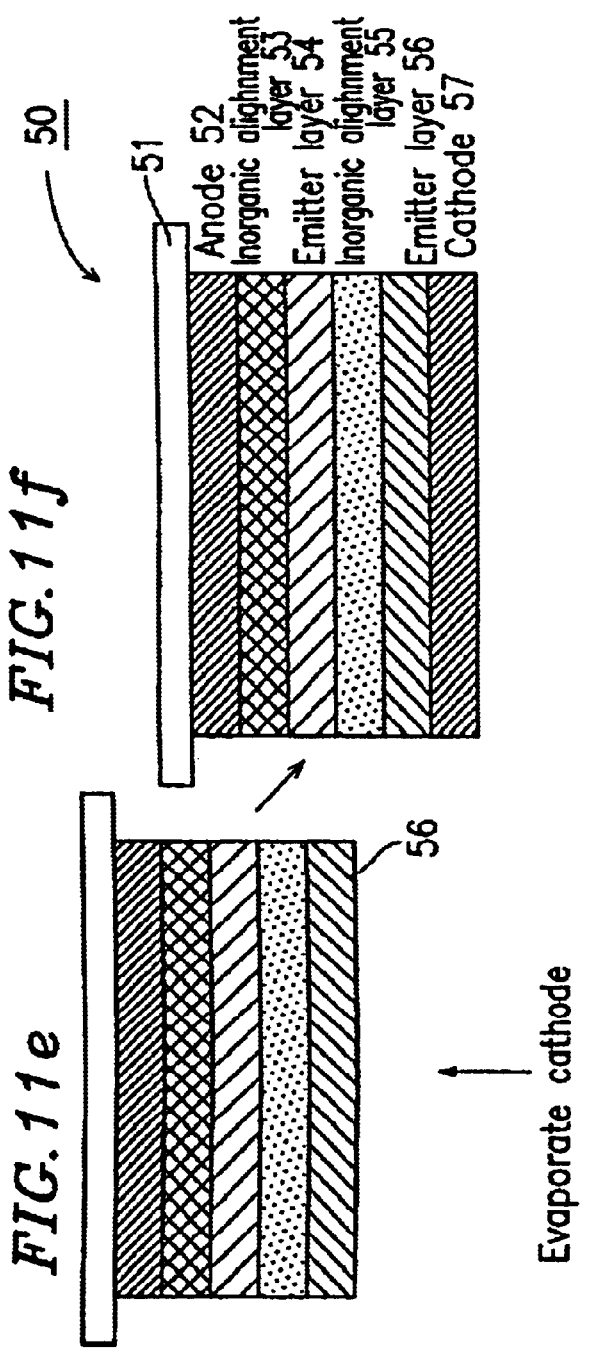

LUMINESCENT DEVICE AND A LIQUID CRYSTAL DEVICE INCORPORATING A LUMINESCENT DEVICE

TECHNICAL FIELD

The present invention relates to a luminescent device. In particular, it relates to a luminescent device which has two or more light-emitting regions. It also relates to a liquid crystal display device incorporating such a luminescent device.

BACKGROUND ART

One well-known luminescent device is an electroluminescent device. An electroluminescent ("EL devices") generates light as a result of electron—hole recombination. An EL device typically has a multilayer structure, in which a light-emitting layer is confined between an anode layer and a cathode layer. The emitter layer may be either an organic material or an inorganic material. Charge carrier recombination occurs in the emitter layer, and photons are generated. It is possible to vary the wavelength of light emitted by an EL device by using different materials for the emitter layer or by applying different drive conditions to the emitter layer, and it is also possible to manufacture an EL device that emits white light.

Many organic emitting materials have relatively broad emission and absorption spectra. If single colour emission, or a narrow colour range, is required, it is possible to use colour filters as disclosed in J. Kido et al, "Science" Vol 267, page 1332 (1995). An alternative approach to obtaining a narrow wavelength range is to use cavity effects to narrow the emission spectrum, as described A. Dodabalapur et al, "Journal of Applied Physics" Vol 80, page 6954 (1996). Although the output wavelength can be narrowed using cavity effects, this approach has the disadvantage that the output becomes very directional and this is undesirable in a display intended to be viewed from a wide range of angles.

In many applications it is desirable to provide a full colour display. One possible way to achieve a full colour EL device involves dividing each pixel into three sub-pixels, with the three sub-pixels lying side by side. One of the sub-pixels emits red light, one green light and one blue light. A device of this type is disclosed in U.S. Pat. No. 5,294,869. One disadvantage of this known device is that each colour is emitted from only one third of the total active area of the device, so that the intensity of the device is low.

An alternative approach to providing a full colour EL device consists of stacking two or more EL devices above one another. Devices of this type are disclosed in P. E. Burrows et al, "Applied Physics Letters" Vol 69, No. 20, Nov. 11, 1996, pages 2959–2961, and in S. R. Forrest et al, "Synthetic Metals" Vol. 91, pages 9–13 (1997).

A stacked, three-layer EL device is shown schematically in FIG. 1. This consists of a red EL element 1 disposed over a green EL element 2 which in turn is disposed over a blue EL element 3. Each EL element comprises a cathode layer 4B, 4G, 4R, an emitter layer 5B, 5G, 5R, and an anode layer 6B, 6G, 6R. Although FIG. 1 shows the EL elements as being separate from one another, in practice they would be stacked with an insulating layer separating each anode-cathode interface.

In the stacked EL device shown in FIG. 1, emission of light of each colour occurs over the entire active cross-sectional area of the device, so that the intensity of the device is improved compared to the device described above which uses laterally divided sub-pixels. However, the EL device shown in FIG. 1 has the disadvantage that light emitted by the red EL element must pass through the other two elements before it is emitted from the device, and that light emitted from the green EL device must pass through the blue EL device. This is a particular problem if organic materials are used to farm the emitter layers in the EL elements, since organic emitting materials generally have relatively broad emission and absorption spectra.

Forrest et al have attempted to address the problem of light emitted in one EL element being absorbed in a subsequent EL element. They have made use of the Stokes effect which provides a shift between the peak emission wavelength and the peak absorption wavelength.

The Stokes shift is illustrated in FIG. 2, which shows the emission and absorption spectra for the three EL elements of the EL device of FIG. 1. The letter "a" indicates the absorption spectra, and the letter "e" indicates the emission spectra. The Stokes shift appears as a shift between the absorption spectrum and the emission spectrum for an EL emitter layer. Forrest et al have chosen materials which have large Stokes shifts so as to minimise the absorption of radiation emitted by one EL element in other EL elements.

The devices proposed by Forrest at al have the following disadvantages. Firstly, the choice of materials for the emitter layers of the EL elements is restricted, owing to the need to use only materials with a large Stokes shift. Moreover, Forrest et al are constrained to use the particular order of the red, green and blue EL elements shown in FIG. 1, so that the red light (with a low energy) subsequently passes through emitter layers having a higher band gap. However, even if the red light is not absorbed across the band gap of the emitter layers in the green and blue EL elements, sole absorption of the red light will inevitably occur as it passes through the blue and green EL elements. The red EL element currently has the lowest intensity of the red, green and blue EL elements. It would thus be preferable to put the red EL element to the front so that the red light did not have to pass through the green and blue EL elements, rather than place it at the back as required by Forrest et al.

A further disadvantage with the prior art is that the EL devices will emit light in both the forward direction (as shown in FIG. 1) and in the backward direction. It would be desirable to utilise the light emitted in the backward direction, as well as the light emitted in the forwards direction, so as to increase the intensity of the device. It is possible to provide a mirror (not shown) above the red EL element of FIG. 1 to reflect the light emitted in the backward direction back towards the blue EL element 3. However, light emitted in the backwards direction by the green or blue EL elements will have to pass through the red EL element twice, once before it reaches the mirror and once after it has been reflected, so that significant absorption will occur. Thus, even if a mirror is provided much of the light emitted in the backward direction will be lost.

In an EL device having an organic emitting layer, the emitting layer is usually evaporated, or spun-down. This will produce an amorphous emitting layer, which emits light having no polarisation. In many applications, it would be desirable to produce an organic EL device that emits polarised light.

One known approach to providing an organic EL device that emits light having some degree of polarisation is to deposit the organic emitting layer with some degree of orientation. This can be done by techniques such as Langmuir-Blodgett deposition, mechanically deforming an organic emitting layer, or rubbing a pure conjugated— polymer emitter layer. An alternative technique is to deposit a polymer layer on a highly aligned orientation layer such as polytetrafluoroethylene or polyimide, or by stretching a polymer layer. A further known technique is disclosed by Weder et al in "Advanced Materials" Vol. 9, page 1035 (1997), in which they disclose the tensile deformation of a guest-host system, so that the guest molecules adopt the orientation of the host.

An alternative approach to providing an organic emitting layer that emits light having some degree of polarisation is the cross-linking of polymeric materials using polarised UV light. This method eliminates the mechanical rubbing step, which is desirable since rubbing may introduce charge, inhomogeneities and dirt into the organic layer. M. Hasegawa et al, "J Photopolym Sci Technol" Vol. 8, page 241 (1995), M. Schadt et al, "Japanese Journal of Applied Physics" Vol. 31, page 2155 (1992) and M. Schadt et al, "Nature" Vol. 381, Page 212 (1996) disclose studies on cross-linking by polarised UV light. WO9707653A discloses an electroluminescent lamp consisting of a combination of an electroluminescent material to irradiate light and a reflecting polarisation multi-layered optical film so as to be able to pass a polarised light therethrough.

DISCLOSURE OF THE INVENTION

A first aspect of the present invention provides a luminescent device having first and second light-emitting regions, wherein the first light-emitting region emits, in use, a first polarised light and the second light-emitting region emits, in use, a second polarised light different from the first polarised light. A luminescent device according to this aspect of the Invention can be used to produce a patterned emitter, that emits polarised light in which the nature of the emitted light varies over the area of the device. Alternatively, a device according to this aspect of the invention can be embodied as a stacked device, to overcome the problems with the prior art stacked EL devices outlined above.

The first light-emitting region may emit, in use, light having a first polarisation and the second light-emitting region may emit, in use, light having a second polarisation different from the first polarisation. The first and second light-emitting regions may each emit, in use, plane polarised light, and the plane of polarisation of light emitted by the first light-emitting region may be different from the plane of polarisation of light emitted by the second light-emitting region. If the two light-emitting regions pan be controlled independently, it is possible to vary the polarisation of light emitted by the device.

The plane of polarisation of light emitted by the first light-emitting region may be at an angle of substantially 90° to the plane of polarisation of light emitted by the is second light-emitting region. If the first and second light-emitting regions are stocked so that light from the first light-emitting region must pans through the second light-emitting region, this difference in the polarisation direction of the two light-emitting regions means that light emitted by the first light-emitting region will not be significantly absorbed in the second light-emitting region, so that light losses in a stacked EL device are reduced.

The first and second light-emitting regions may be disposed side by side. Alternatively, the first light-emitting region may be disposed over the second light-emitting region.

The device may further include a third light-emitting region, with the first light-emitting region disposed over the second light-emitting region, and the second light-emitting region being disposed over the third light-emitting region. If the three light-emitting regions are independently controllable and emit light of different wavelengths to one another, a full-colour light-emitting device can be obtained.

The third light-emitting region may emit polarised light having a third polarisation which is different from at least one of the first and second polarisations. The first, second and third light-emitting regions may emit plane-polarised light, with the plane of polarisation of the light emitted by the second light-emitting region being at substantially 60° to the plane of polarisation of the light emitted by the first light-emitting region, and the plane of palarisation of light emitted by the third light-emitting region may be at substantially 120° to the plane of polarisation of light emitted by the first light-emitting region. This will again reduce absorption of light emitted by the first light-emitting region as it passes through the second and third light-emitting regions, and will also reduce the absorption of light emitted by the second light-emitting region as it passes through the third light-emitting region.

The first light-emitting region may emit, in use, polarised light having a first wavelength and the second light-emitting region may emit, in use, polarised light having a second wavelength different from the first wavelength. If the two light-emitting regions are controllable independently, it is then possible to vary the wavelength of light emitted by the devices The first and second light-emitting regions may each emit, in use, plane-polarised light. The plane of polarisation of light emitted by the first light-emitting region may be substantially parallel to the plane of polarisation of light emitted by the second light-emitting region. Alternatively, the first and second light-emitting regions may each emit, in use, circularly-polarised light, and the first and second light-emitting regions may each emit, in use, circularly-polarised light. The sense of palarisation of light emitted by the first light-emitting region may be the same as the sense of polarisation of light emitted by the second light-emitting region.

The device may be an electro-luminescent device.

A second aspect of the present invention provides a luminescent device having first and second light-emitting regions, wherein the emitter molecules in the first light-emitting region are aligned substantially in a first direction and the emitter molecules in the second light-emitting region are aligned substantially in a second direction, the second direction being different from the first direction. The first light-emitting region may emit, in use, light having a first polarisation and the second light-emitting region may emit, in use, light having a second polarisation different from the first polarisation. The polarisation of the emitted light arises from the alignment of the emitter molecules, and the difference in polarisation between light emitted from the first and second light-emitting regions is due to the different alignment directions in the two light-emitting regions. Alternatively, the first light-emitting region may emit, in use, light having a different wavelength to light emitted, in use, by the second light-emitting region.

A third aspect of the present invention includes a layer of liquid crystal material disposed over a backlight; wherein the backlight includes a luminescent layer, a first portion of the luminescent layer emitting, in use, polarised light at a first wavelength and a second portion of the luminescent layer emitting, in use, polarised light at a second wavelength.

The device may further include a first colour filter for transmitting light of the first wavelength and a second colour filter for transmitting light of the second wavelength, the first and second colour filters each being aligned with a respective one of the first and second portions of the luminescent layer.

The first and second portions of the luminescent layer may emit plane-polarised light. The plane of polarisation of light emitted by the first portion of the luminescent layer may be substantially parallel to the plane of polarisation of light emitted from the second portion of the luminescent layer. Alternatively, the first and second portions of the luminescent layer may emit circularly polarised light.

The luminescent layer may be an electroluminescent layer.

A fourth aspect of the present invention provides a method of manufacturing an emitter region for an electroluminescent device, the method including the steps of: evaporating an alignment layer over a substrate, the direction of evaporation being oblique to the substrate; and evaporating emissive molecules onto the alignment is layer so as to form the emitter layer, the direction of evaporation of the emissive molecules being substantially perpendicular to the substrate.

The orientation of the molecules in the emitter layer will be controlled by the alignment direction of the alignment layer, and this will depend on the angle between the evaporation direction and the substrate when the alignment layer is evaporated. This method can be used to manufacture a stacked EL device having two (or more) emitter layers with the emitter molecules in one emitter layer being aligned in a different direction from the emitter molecules in the other emitter layer, by growing each emitter layer over an obliquely deposited alignment layer.

BRIEF DESCRIPTION OF THE DRAWINGS

Preferred embodiments of the present invention will now be described by way of illustrative examples with reference to the accompanying Figures in which:

FIG. 2 shows the absorption and emission spectra for the three EL elements of the device of FIG. 1;

FIG. 5b shows the polarisation directions for the three EL layers of the device of FIG. 5a;

FIG. 6a shows an EL device according to a further embodiment of the present invention;

FIG. 6b shows an EL device according to a further embodiment of the present invention;

FIGS. 11a to 11f show steps in the manufacture of a stacked EL element according to the invention;

BEST MODE FOR CARRYING OUT THE INVENTION

Figure 1:
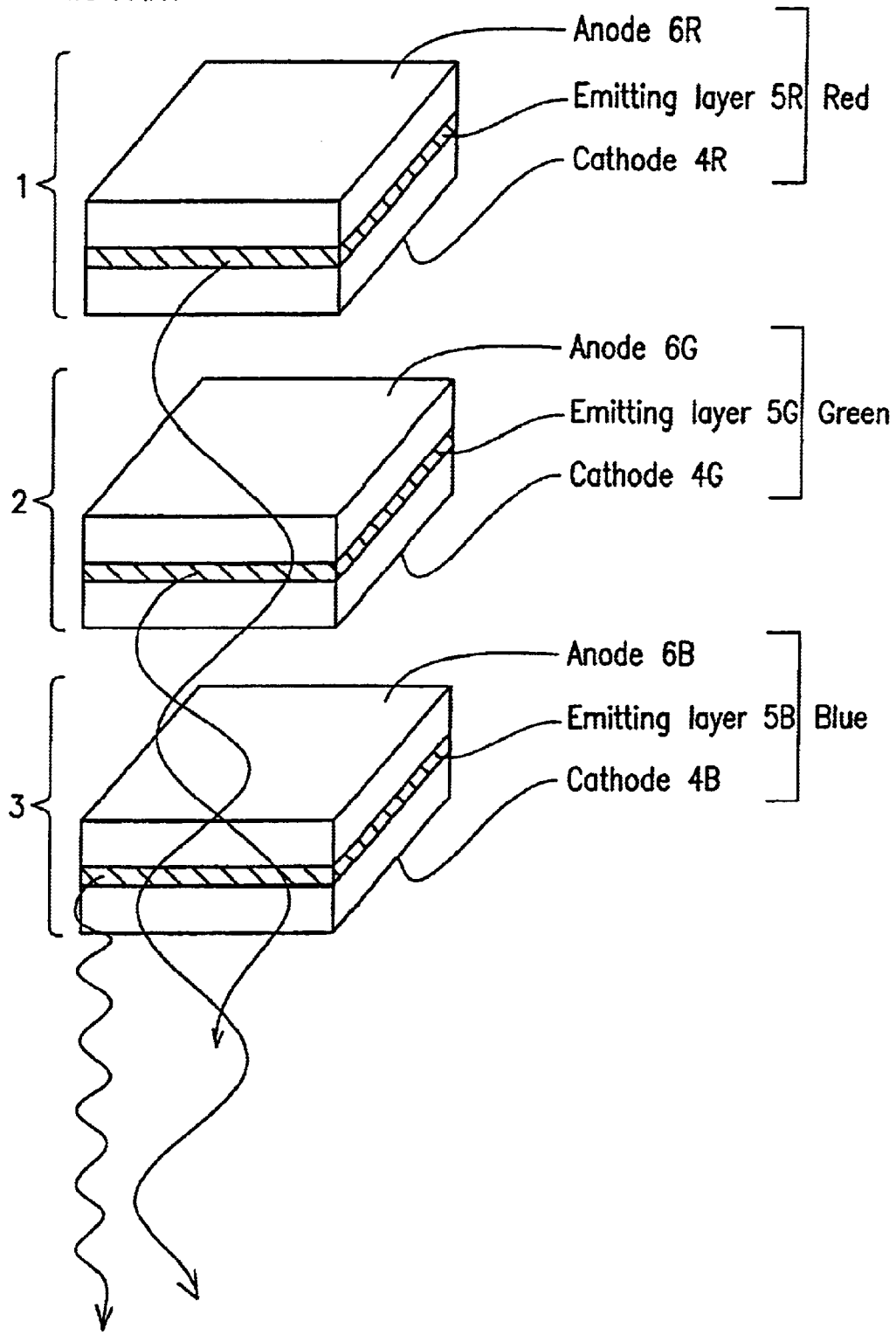
FIG. 1 is a schematic sectional view of a prior art three-layer electroluminescent device.
Figure 3:
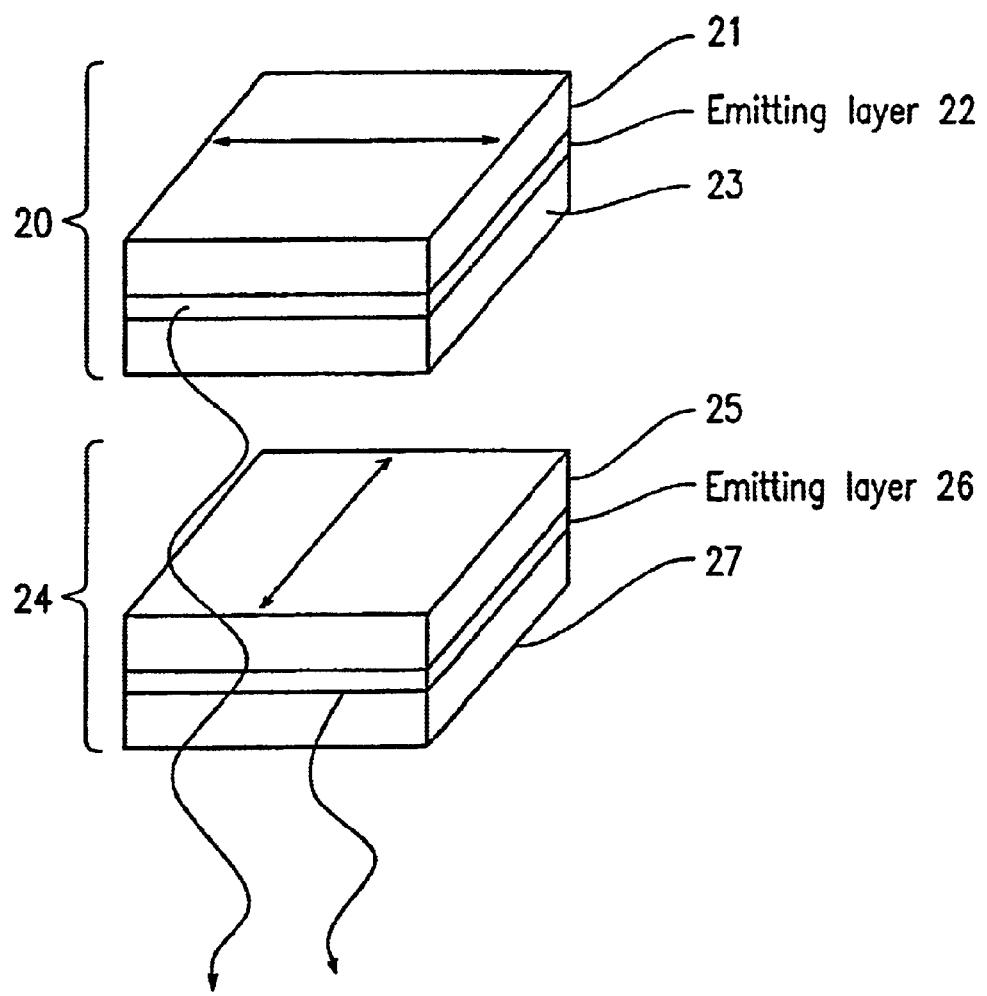
FIG. 3 is a schematic view of an EL device according to a first embodiment of the invention.

FIG. 3 is a schematic illustration of a two-layer luminescent device according to the present invention. It has a first EL device 20 comprising an anode 21, an emitter layer 22, and a cathode layer 23. This is disposed over a second EL device 24 which consists of an anode layer 25, an emitter layer 26 and a cathode layer 27.

The two emitter layers 22, 26 may emit light of different wavelengths, or of the same wavelength. The two emitter layers can be controlled independently from one another.

The emitter layers 22, 26 emit light that is substantially plane-polarised (this will hereinafter be referred to as "plane-polarised light" for convenience). The plane of polarisation of the light emitted by the emitter layer 22 is at 90° to the plane of polarisation of light emitted by the emitter layer 26 of the second EL element 24.

The polarisation of the emitted light is achieved by orienting the light-emitting molecules within an emitter layer so that they are all aligned in substantially the same direction within the plane of the emitter layer. The electric field director of the plane-polarised light will be perpendicular to the direction of the alignment of the emitter molecules.

An emitter molecule is not able to absorb light whose electric field director is parallel to its length. Thus, in the device shown in FIG. 3, the emitting molecules in the emitter layer 26 of the second EL element will not be able to absorb the light emitted by the first EL element, since this is plane-polarised at 90° to their absorption direction. In consequence the absorption of light emitted by the first EL element 20 in the emitter layer of the second EL element 24 will be eliminated or, at least, greatly reduced.

The present invention has a number of advantages over the prior art. Firstly, since the absorption of light emitted by one EL element in another EL element is substantially prevented by polarising the light, there is no need to restrict the choice of the emitter layers to materials with large Stokes shifts as in Forrest et al. This means that many more materials can be used in the EL elements.

Moreover, in a case where the EL elements emit light with different wavelengths, there is no need to place the long wavelength EL element behind the short wavelength EL element. Thus, a red EL element can be placed at the front of the device and this, as noted above, is desirable since red EL elements tend to be less intense than EL elements emitting light of other wavelengths.

Since absorption of light emitted by one EL element in the other EL element is prevented by the polarisation of the light, it is even possible for the two EL elements to emit light at the same wavelength. Since the two EL elements are independently controllable, this would produce a device for emitting polarised light, with the capability of easily changing the polarisation state of the output light.

Since light emitted by one EL element is not absorbed by the other EL element owing to the polarisation of the light, it is now possible to utilise the light emitted in the backwards direction by providing a mirror at the back of the device.

Figure 4:
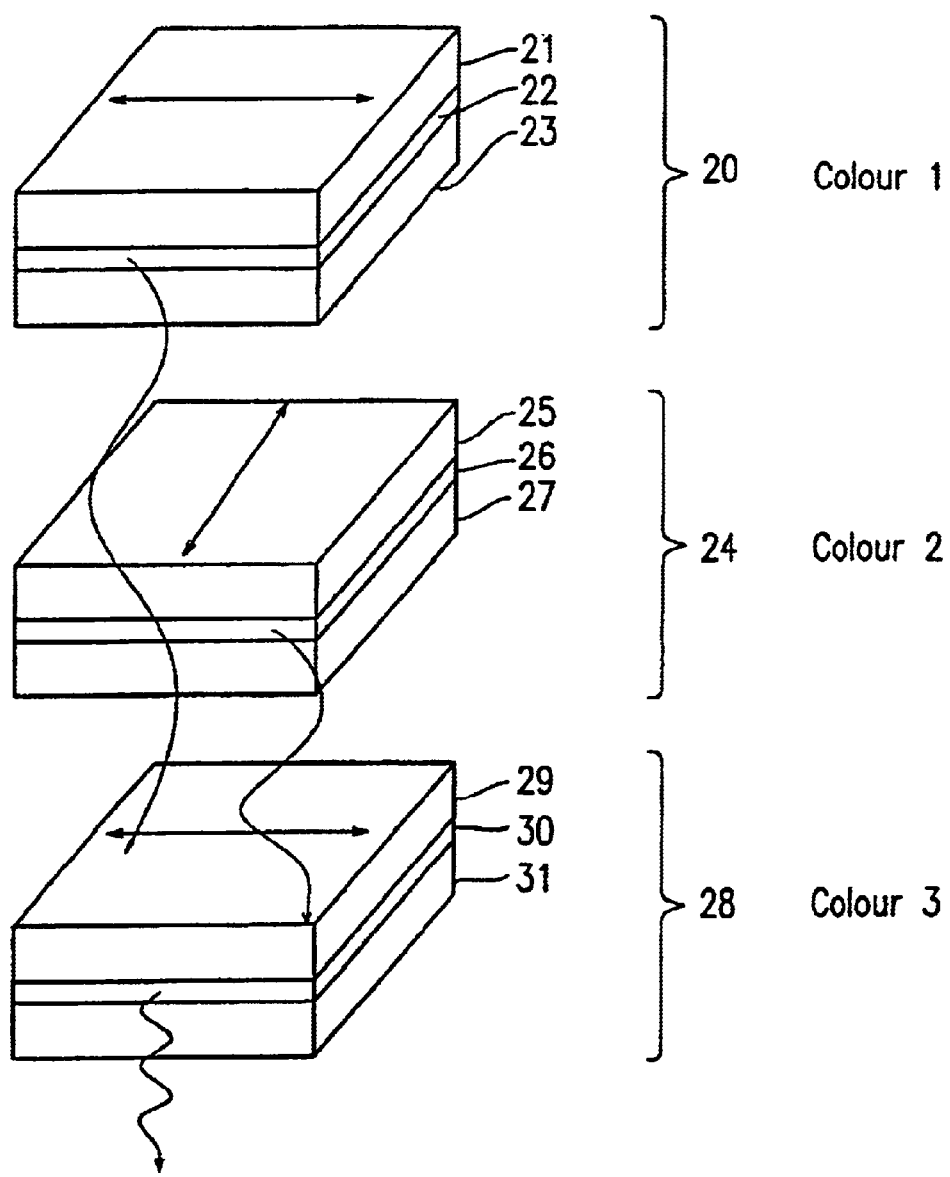
FIG. 4 is a schematic view illustrating a three-layer EL device according to another embodiment of the present invention.

The present invention is not limited to a two-layer EL device, but can be applied to EL devices having three or more layers. An example showing the invention applied to a three-layer EL device is shown in FIG. 4. Compared with the device shown in FIG. 3, the device shown in FIG. 4 additionally comprises a third EL element 28, having an anode layer 29, an emitter layer 30 and a cathode layer 31. The three EL elements can be controlled independently, if EL elements that emit light at three different wavelengths such as red, green and blue, are used, a full-colour display can be obtained.

The emitter layer 30 is arranged to emit light that is plane-polarised in the same direction as the light emitted by the emitter layer 22 of the first EL element 20, and which is plane-polarised at 90° to the plane of polarisation of light emitted by the emitter layer 26 of the second EL element 24. Because of the different directions of polarisation, the green emitter layer is not able to absorb the red light emitted by the red EL device, and the blue emitter layer is not able to absorb any green light emitted by the green EL element. It is possible, however, for the blue emitter layer to absorb light emitted by the red EL element, since the red emitter layer 22 and the blue emitter layer 30 are arranged to emit light that has the same direction of polarisation. However, as shown in FIG. 2, the emission spectrum for the red emitter layer is sufficiently far removed from the absorption spectrum for the blue emitter layer so that there is unlikely to be significant absorption of red light in the blue emitter layer.

A suitable material for the emitter layer of the green EL element is PPV. A suitable material for the emitter layer of the red EL element is DCM/NIR in PPV. (DCM is 4-(dicyanomethylene)-2-methyl-6-(4-dimethyl-6-(4-dimethylaminostyrl))-4H-pyran, and NIR is Nile Red.) A suitable emitter material for the blue EL element is distyrlybenzene in polycarbozole.

Figure 5A:
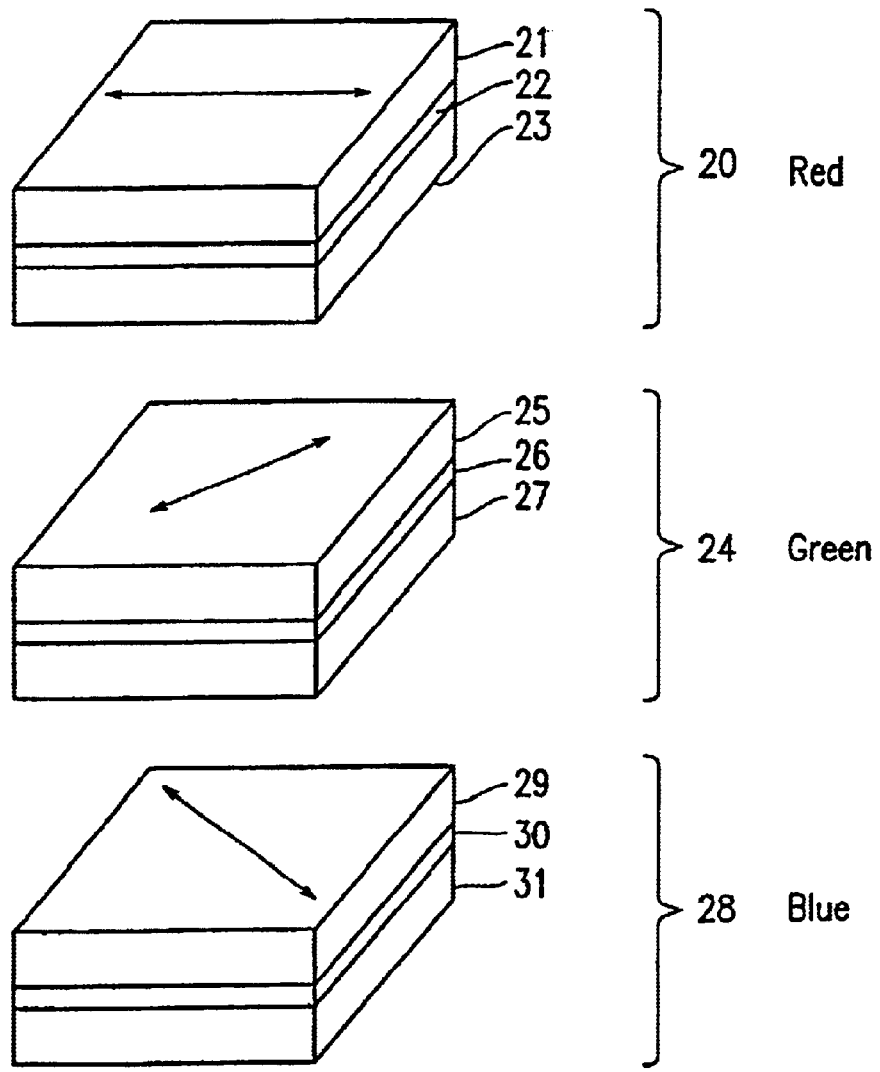
FIG. 5a shows a modification of the embodiment of FIG. 4.

An alternative arrangement for a three-layer EL device is shown schematically in FIG. 5a. As with the device of FIG. 4, this consists of a red EL element 20, a green EL element 24, and a blue EL element 28. The emitter layers 22, 26 and 30 of the three EL elements are again arranged to emit plane-polarised light.

Figure 5B:
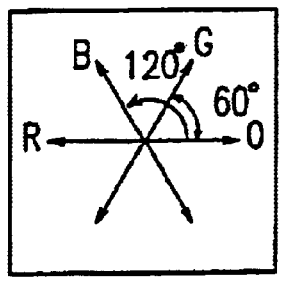

In the embodiment of FIG. 5a, the emitter layer 26 of the green EL element 24 is arranged to emit light that is plane-polarised at 60° to the direction of the plane-polarised light emitted by the emitter layer 22 of the red EL element. The blue EL element 28 emits light that is plane-polarised at 60° to the plane of polarisation of the light emitted by the green EL element 24, and at 120° C. to the plane of polarisation of light emitted by the red EL element 20. The polarisations of the red, green and blue light emitted by the three EL elements are shown schematically in FIG. 5b.

Since the planes of polarisation of the red and green light are not orthogonal, there will be some slight absorption of red light in the emitter layer 26 of the green EL element. However, this will be reduced by a factor of approximately $\cos^2 60$—that is, to approximately one quarter of the absorption that would occur in the case where the EL elements emitted unpolarised light. Similarly, the emitter layer 30 of the blue EL element will absorb both red and green light, but this absorption will be reduced by a factor of $\cos^2 60$ compared to a case where amorphous emitter layers were used.

Whether the arrangement shown in FIG. 4 or the arrangement shown in FIG. 5a is preferable will depend on factors such as the relative intensities of the three EL elements.

In the embodiments described above, the two or more luminescent portions of the device have been disposed one above another in order to produce a stacked device. The present invention is not, however, limited to a stacked device, but can also be applied to a device in which two or more luminescent regions are disposed side by side. If the luminescent regions are disposed side by side it is possible to obtained a patterned emitter of polarised light, in which the nature of the light emitted by the device varies over the area of the device. For example, the wavelength of light emitted by the device can vary over the area of the device, or the polarisation of the light emitted by the device can vary over the area of the device.

A patterned, polarised emissive device according to the invention is shown schematically in FIG. 6a. This device comprises two emissive regions 34, 35 that are disposed side by side. The two emissive regions emit light having substantially the same wavelength, but having different polarisations. As is indicated in FIG. 6a, both regions 34, 35 emit plane-polarised light, but the plane of polarisation of light emitted by one region is at substantially 90° to the plane of palarisation of light emitted by the other region. The two emissive regions are controllable independently, so that it is easily possible to vary the polarisation of light emitted by the device. The emissive regions can be luminescent regions, for example electroluminescent regions.

In FIG. 6a the two regions emit light having the same wavelength but different polarisation. It would alternatively be possible for the two regions to emit light having the same polarisation—for example, plane-polarised in the same direction—but at different wavelengths. Thus, the device would provide a source of polarised light whose wavelength spectrum could be easily varied.

It would also be possible for the two regions 34, 35 of the device of FIG. 6a to emit light having a polarisation other than plane-palarisation, such as elliptical or circular polarisation.

A further embodiment of the invention to shown in FIG. 6b. This is a two-layer device, which consists of a first EL element 31 disposed over a second EL element 32. Each of the EL elements is laterally sub-divided into three light-emitting areas. The first EL element 31 has a light-emitting area 31A that emits green light, and two areas 31B, 31C which emit blue light. The second EL element 32 has two areas 32A, 32B which emit red light and an area 32C which emits green light. The two EL elements are arranged such that the light-emitting areas of the first EL element are placed directly over the light-emitting areas of the second EL element 32. Adjacent light-emitting areas of each EL element are separated by a non-emissive region 33. The light-emitting areas are independently controlled.

As indicated in FIG. 6b, the two EL elements are both arranged to emit plane-polarised light, with the light emitted by the first EL element 31 being polarised at 90° to the light emitted by the second EL element 32. This means that light emitted by one EL element will not be absorbed in the emitter layer of the other EL element.

Figure 7:
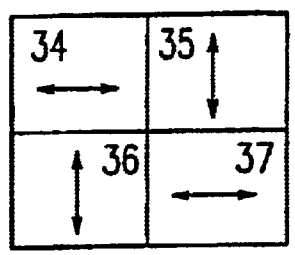
FIG. 7 is a schematic plan view of an EL element according to a further embodiment of the invention.

FIG. 7 shows a further embodiment of the present invention. This to a one-layer EL element, in which the emitter layer is divided into four emissive regions 34, 35, 36, 37. The emissive regions all emit plane-polarised light, but two of the regions 34, 37 emit light that is plane-polarised in one direction, and the other two regions 35, 36 emit light that is plane-polarised at 90° to the direction of polarisation of light emitted by the regions 34, 37. The four emissive regions 34, 35, 36, 37 are controllable independently from one another.

If the four emissive regions emit light at substantially the same wavelength the polarisation of the light from the EL element can be changed easily, for example by switching emissive regions 34, 37 OFF and switching emissive regions 35, 36 ON.

Figure 8:
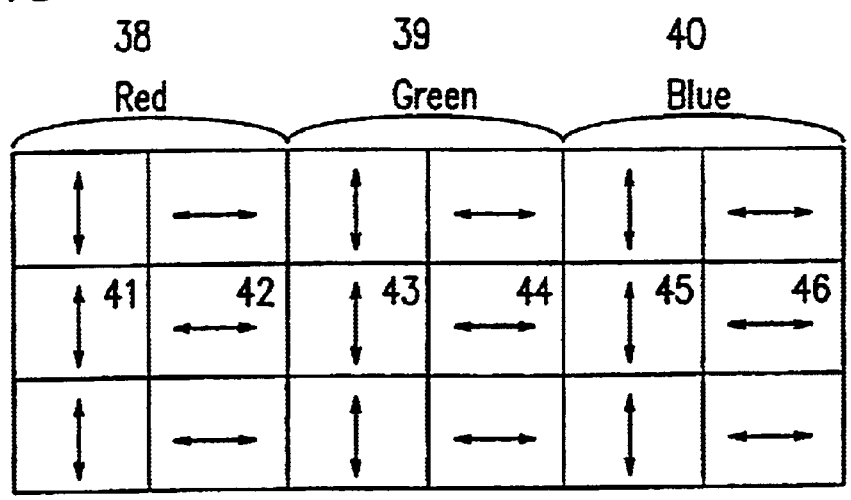
FIG. 8 is a schematic plan view of an EL element according to a further embodiment of the present invention.

A related embodiment is shown in FIG. 8, This is a one—layer EL element, in which the emissive layer has a red emissive region 38, a green emissive region 39, and a blue emissive region 40. The red, green and blue emissive regions, in turn, are divided into regions 41, 43, 45 which emit light plane-polarised in one direction and other regions 42, 44, 46 which emit light plane polarised in an orthogonal direction. Thus, the EL device shown in FIG. 8 provides a full-colour output, the polarisation state of which can easily be varied. Such an EL element could be used in, for example, a 3-D display device. In a modification (not illustrated) of this embodiment, the regions 41, 43, 45 emit light that is circularly-polarised in one sense and the other regions 42, 44, 46 emit light that is circularly-polarised in the opposite sense.

Figure 9:
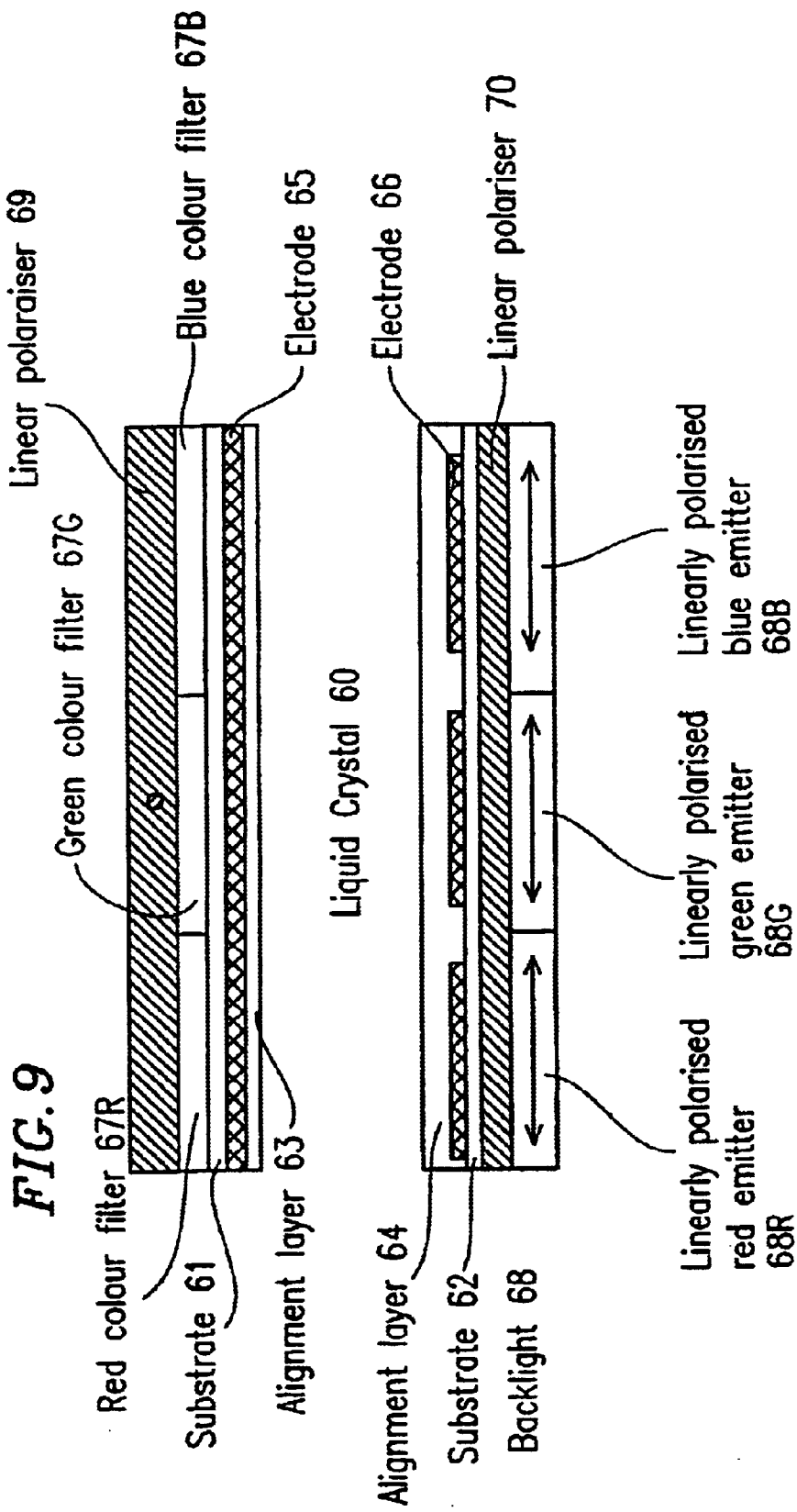
FIG. 9 is a schematic sectional view of a liquid crystal device incorporating an EL device as a backlight.

FIG. 9 shows a liquid crystal display device that incorporates a luminescent element as a backlight.

The liquid crystal display consists of a layer of liquid crystal material 60 disposed between a pair of substrates 61, 62. One or more electrodes 65, 66 for applying a voltage across each pixel of the liquid crystal layer are provided on the substrates, and an alignment layer 63, 64 is disposed on each substrate, over the electrode(s) disposed on that substrate. In the embodiment of FIG. 9 the device is an active matrix device, so that the electrodes 66 on the lower substrate 62 are pixel electrodes, and a single electrode 65 is provided on the upper substrate 61 as a common electrode. The device of FIG. 9 could alternatively be embodied as a passively addressed liquid crystal device, in which case row electrodes would be provided on one substrate and column electrodes would be provided on the other substrate.

The LCD shown in FIG. 9 is a full colour display device. A first pixel is provided with a red colour filter 67R, a second pixel is provided with a green filter 67G, and a third pixel is provided with a blue filter 67B. Only three pixels are shown in FIG. 9, but in practice the device will comprise more than three pixels.

The LCD of FIG. 9 Is provided with a backlight 68. The backlight is formed of a patterned, linearly polarised emitter. The backlight 68 shown in FIG. 9 contains a first emissive element 68R that emits linearly polarised red light, a second emissive element 68G that emits linearly polarised green light, and a third emissive element 68B that emits linearly polarised blue light. The red, green and blue emissive elements 68R, 68G, 68B are disposed laterally, and are positioned opposite the red, green and blue colour filters 67R, 67G, 67B respectively.

The red, green and blue emissive elements 68R, 68G, 68B can, in principle, be formed of any luminescent device that emits polarised light. In one preferred embodiment they are EL elements in which the emissive molecules have been oriented so that the element emits plane-polarised light. The emissive molecules in the three EL elements 68R, 68G, 68B, are oriented so that the three EL elements emit light that is plane-polarised in approximately the same plane of polarisation.

A linear polariser 69 in provided on the upper face of the upper substrate 61, and this is arranged with its transmission axis at substantially 90° to the plane of polarisation of light emitted by the emissive elements 68R, 68G, 68B. When the voltage applied to a pixel of the liquid crystal layer is such that the liquid crystal layer does not rotate the plane of polarisation of light emitted by the emissive element in the pixel, the light emitted by the emissive element will be blocked by the linear polariser 69, and the pixel will appear dark. If, however, the voltage applied across the pixel is such that the plane of polarisation of light emitted by the emissive element in the pixel is rotated by 90°, then the light will be transmitted by the linear polariser 69 and the pixel will appear bright.

In principle, if the emissive elements 68R, 68G, 68B all emit light that to plane-polarised at substantially 90° C. to the transmission axis of the polariser 69, no further optical components are required in the LCD. However, if the light emitted by the emissive elements should contain an unpolarised component, then the contrast of the display would be degraded. To prevent this, the device of FIG. 9 is preferably provided with a second linear polariser 70, that is disposed between the emissive elements 68R, 68G, 68B and the liquid crystal layer 60 (in FIG. 9, this second polariser 70 is disposed on the lower face of the lower substrate 62). The transmission axis of the second polariser 70 is arranged at substantially 90° to the transmission axis of the first polariser 69 and is thus substantially parallel to the plane of polarisation of light emitted by the emissive elements 68R, 68G, 68B. The second polariser 70 converts any unpolarised light emitted by the emissive elements to plane-polarised light that is polarised at 90° to the transmission axis of the first polariser 69.

In FIG. 9 the emissive elements 68R, 68G and 68B are positioned close to the lower substrate of the LCD, in order to prevent parallax problems occuring when the device is viewed at an oblique angle. It would alternatively be possible to dispose the emissive elements 68R, 68G, 68B at a distance from the lower substrate 62 of the LCD, and dispose a collimating element such as, for example, a microlens array between the emissive elements and the lower substrate 62.

Figure 10:
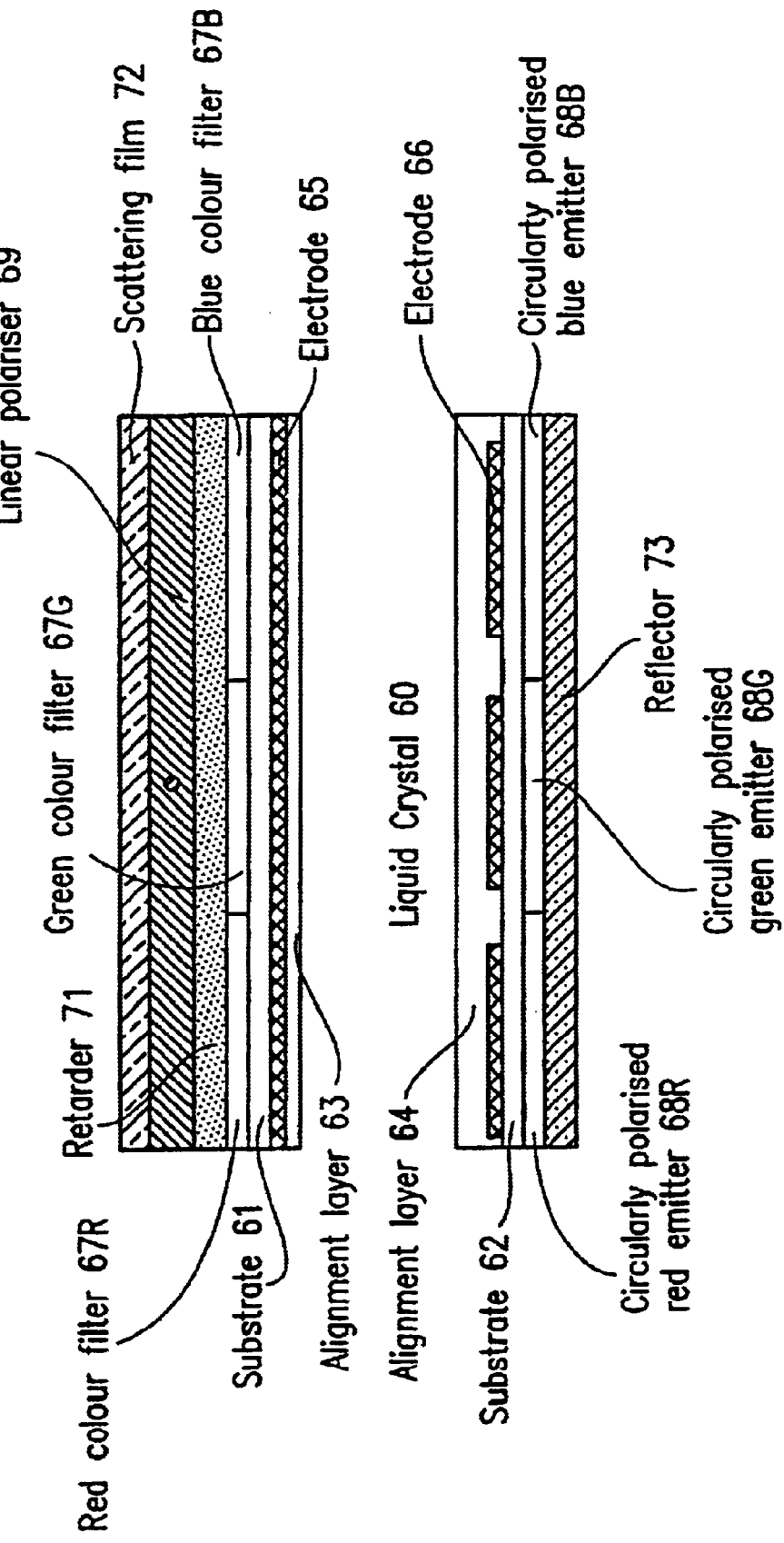
FIG. 10 is a schematic sectional view of a transflective liquid crystal display device incorporating an EL element as a backlight.

FIG. 10 shows another embodiment of a liquid crystal display device provided with a backlight. This embodiment is a transflective display device.

As with the embodiment of FIG. 9, the liquid crystal display device of FIG. 10 comprises a liquid crystal layer 60 disposed between upper and lower substrates 61, 62. Each substrate is provided with one or more electrodes 65, 66 and an alignment layer 63, 64. Red, green and blue colour filters 67R, 67G, 67B are disposed on the upper substrate, and red, green and blue emissive elements 68R. 68G, 68B are disposed on the lower substrate opposite the respective colour filter. A linear polariser 69 is disposed above the upper substrate 61.

The device of FIG. 10 is a transflective device, and comprises a reflector 73 disposed below the red, green and blue emissive elements. A retarder 71 to disposed between the linear polariser 69 and the liquid crystal layer.

The emissive elements 68R, 68G, 68B forming the backlight of the LCD emit circularly polarised light.

In operation the voltage applied across a pixel of the liquid crystal layer 60 is switched such that the overall retardation caused by the liquid crystal layer and the retarder 71 is switched between 0 and $\lambda/4$, or between $\lambda/2$ and $\lambda/4$. When the overall retardation of the liquid crystal layer 60 and the retarder 71 for a pixel is $\lambda/4$ (or $n\lambda/2+\lambda/4$, where n is an integer), ambient light that is incident on the device from above is not reflected by the device. Light incident on the device from above is plane-polarised by the polariser 69, and as converted to circularly polarised light as a result of its passage through the retarder 71 and the liquid crystal layer 60. After reflection at the reflector 73, the light again passes through liquid crystal layer and the retarder and is converted back to plane polarised light. However, the sense of the circular polarisation of the light will have changed as a result of the reflection at the reflector 73, so that the resultant plane-polarised light will in fact be polarised at 90° to the transmission axis of the linear polariser 69. Thus, ambient light incident on the device will not be reflected. Furthermore, the circularly polarised light emitted by the emissive elements is converted to plane-polarised light, and the polariser 69 is arranged such that its transmission axis is at 90° to the plane of polarisation of this light. Thus, light emitted by the emissive elements 68R, 68B, 68G is not able to pass through the linear polariser 69. The pixel thus is in a dark state.

On the other hand, when the overall retardation of the liquid crystal layer 60 for a pixel and the retarder is 0 or λ/2 (or any integer multiple of λ/2), ambient light is reflected by the device, and light emitted by the emissive elements 68R, 68G, 68B is, at least partially, transmitted through the polariser 69 so that the pixel is in a bright state.

The colour filters 67R, 67G, 67B are provided primarily for use with reflected ambient light. If the emissive regions can be arranged to absorb in a wavelength range similar to the absorption range of the colour filters, it is possible to make the colour filters thinner, or even to eliminate the colour filters entirely.

In FIG. 10 the emissive regions 68R, 68G, 68B are disposed on the lower face of the lower substrate 62. They are not, however, limited to this position, but can be disposed at other positions within the device.

A scattering film 72 can be disposed on the upper surface of the LCD, to reduce specular reflection of light from the front face of the LCD.

One method of producing an EL element having an emissive layer in which the emissive molecules are aligned in a particular direction consists of suspending the emissive molecules in a fluid such as reactive mesogen RM257 (available from Merck Ltd). Next, the molecules are oriented so that they are all aligned in a particular direction. This can be done, for example, by applying an electric field or a magnetic field. The fluid matrix is then "fixed", so that the emissive molecules are no longer able to move within the matrix. The matrix can be fixed by, for example, irradiating the matrix with UV light. Thus, the alignment direction of the emissive molecules within the matrix is set. The electric or magnetic field can then be removed.

As an alternative to fixing the entire fluid matrix, it is possible to fix just selected parts of the fluid matrix. This can be done, for example, by irradiating the fluid matrix through a mask pattern, so that only selected areas are irradiated. The device illustrated in FIG. 7 could be produced by applying an electric field to align the emissive molecules in the directions required in the regions 34 and 37, and then irradiating only the areas 34, 37 to fix the matrix in these regions. The direction of the applied electric field is then changed, to orient the emissive molecules in the region 35, 36 correctly, after which the regions 35, 36 are irradiated so as to fix the matrix in these areas.

One possible method of manufacturing a stacked EL element in which the emissive molecules in different EL layers are oriented in different directions will now be described with reference to FIGS. 11a to 11f. Although FIGS. 11a to 11f relate to the manufacture of a stacked EL element having two EL layers, the method can be applied to a stacked EL element having any number of EL layers.

Figure 11A:
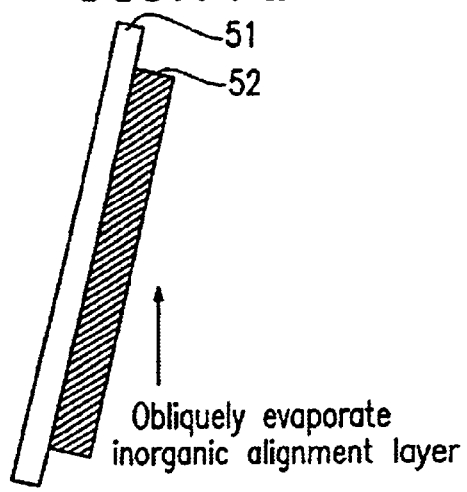

The EL element 50 is grown on a substrate 51 on which is provided an anode electrode 52. In FIG. 11a, a first inorganic alignment layer 53 is evaporated onto the anode electrode 52. The evaporation of the first alignment layer 53 is carried out such that the direction of evaporation is oblique to the substrate 50, and the alignment direction of the alignment layer will depend on the angle between the direction of evaporation and the substrate. This is well-known in the field of anisotropic materials such as liquid crystals.

Figure 11B:
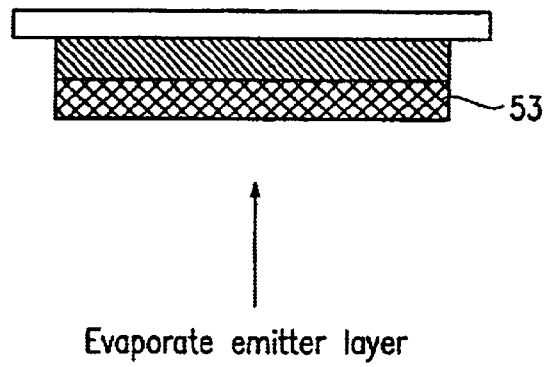

In FIG. 11b, a first EL emitter layer 54 is evaporated onto the alignment layer 53. The evaporation of the emitter layer 54 is carried out such that the direction of evaporation is substantially perpendicular to the substrate 50. The molecules of the emitter layer 54 will be aligned by the alignment layer 53, to be either parallel or perpendicular to the evaporation plane.

Figure 11C:
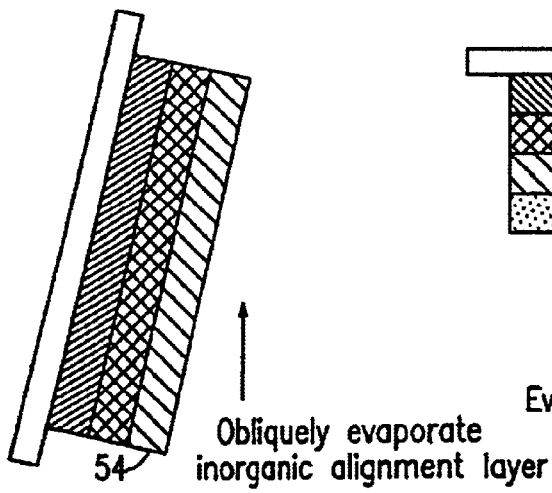

In FIG. 11c, a second inorganic alignment layer 55 is evaporated onto the emitter layer 54. The evaporation of the second alignment layer 55 is carried out such that the direction of evaporation is oblique to the substrate 50. The angle between the direction of evaporation and the substrate is not the same in FIG. 11c as in FIG. 11a, so that the alignment direction of the second alignment layer 55 is not the same as the alignment direction of the first alignment layer 53.

Figure 11D:
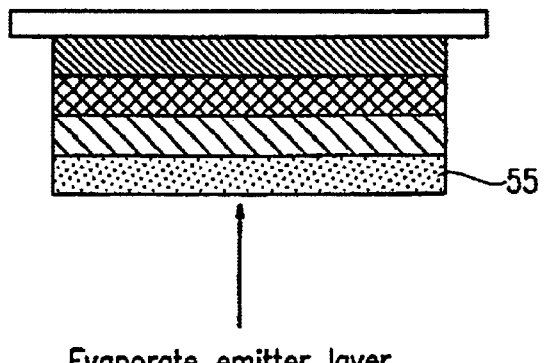

In FIG. 11d, a second EL emitter layer 56 is evaporated onto the second alignment layer 55. The evaporation of the second emitter layer 56 is carried out such that the direction of evaporation is substantially perpendicular to the substrate 50. The molecules of the second emitter layer 56 will be aligned by the second alignment layer 55 to be either perpendicular or parallel to the evaporation plane, so that they are aligned in a different direction to the molecules in the first emitter layer 54.

Finally, in FIG. 11e a cathode electrode 57 is evaporated onto the second emitter layer 56. The evaporation of the cathode electrode 57 is carried out such that the direction of evaporation is substantially perpendicular to the substrate 50. The structure of the completed EL element is shown in FIG. 11f.

It would be possible for the anode layer 52 and the first alignment layer 53 to be combined in a single layer. This layer should be deposited by oblique evaporation, as shown in FIG. 11a.

It is possible to provide additional transport layers between the anode electrode 52 and the first alignment layer 53, or between the second emitter layer 56 and the cathode electrode 57.

The method of FIGS. 11a to 11f can be used to grow stacked EL elements having 3 or more emitter layers. It is simply necessary for each emitter layer to be preceded by an obliquely evaporated alignment layer.

Figure 12:
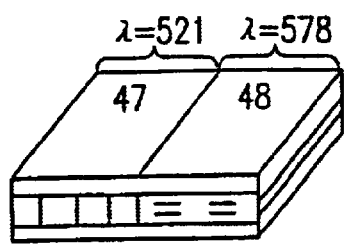
FIG. 12 to a schematic plan view of an EL element capable of emitting light at two different wavelengths according to a further embodiment of the present invention.

A further embodiment of the invention is illustrated in FIG. 12. This is a one layer EL device, in which the emissive layer to divided into two regions.

It is also possible to alter the wavelength of light emitted by the emissive layer by orienting the emitter molecules. It is known that some emissive molecules show a change in their emission wavelength when they are orientated in an applied electric field. An example of such a compound is NIR (Nile Red), as reported by S. Nilar et al, "Journal of Applied Physics", Vol. 82, page 514 (1997). An EL device containing NIR will normally emit light having a peak wavelength of 578 nm. If, however, the emissive molecules are aligned to be perpendicular to the emissive layer, for example by applying an electric field, the emission wavelength changes to 521 nm.

In the device shown in FIG. 12, one part of the emissive layer, which contains NIR, has been subjected to an electric field to align the NIR molecules perpendicular to the emissive layer. The region 47 is then selectively fixed, to fix the NIR molecules in the perpendicular alignment. Upon removal of the electric field, the molecules in the unfixed region 48 will relax back to the parallel orientation. Thus, the region 47 of the light-emitting layer will emit light having a peak wavelength of 521 nm, whereas the region 48 of the emissive layer will emit light having a peak wavelength of 578 nm. If the two regions 47, 48 are controllable independently from one another, it is then possible to alter the output wavelength of the device just by switching, for example, region 47 OFF and region 48 ON.

The device shown in FIG. 12 can also be produced using techniques which pattern surfaces into regions favouring homeotropic alignment and regions favouring planar alignment. Suitable techniques are described in co-pending UK patent application 9822762.2.

Devices according to the present invention can be manufactured by methods other than the methods described above. Indeed, they Can be manufactured in principle by any method that will provide an electroluminescent layer that emits polarised light. Any method providing an oriented polymer, or an oriented organic material, could be used. For example, it could be possible to pattern the substrate such that the emissive molecules in the emitter layer are oriented by the patterns on the substrate as the emitter layer is deposited. Techniques that could be used include, but are not limited to, the following:

i) topographically patterned surfaces;

ii) masked, multiple rubbed polymer alignment layers, where one rubbing stop is carried out on one un-masked portion of the layer, after which the rubbed portion is masked and another portion of the layer is rubbed in a different direction; and iii) rubbing a polymer alignment layer, and subsequently exposing it to UV light through a mask so as to cause bond breaking in selected areas of the alignment layer.

Figure 13:
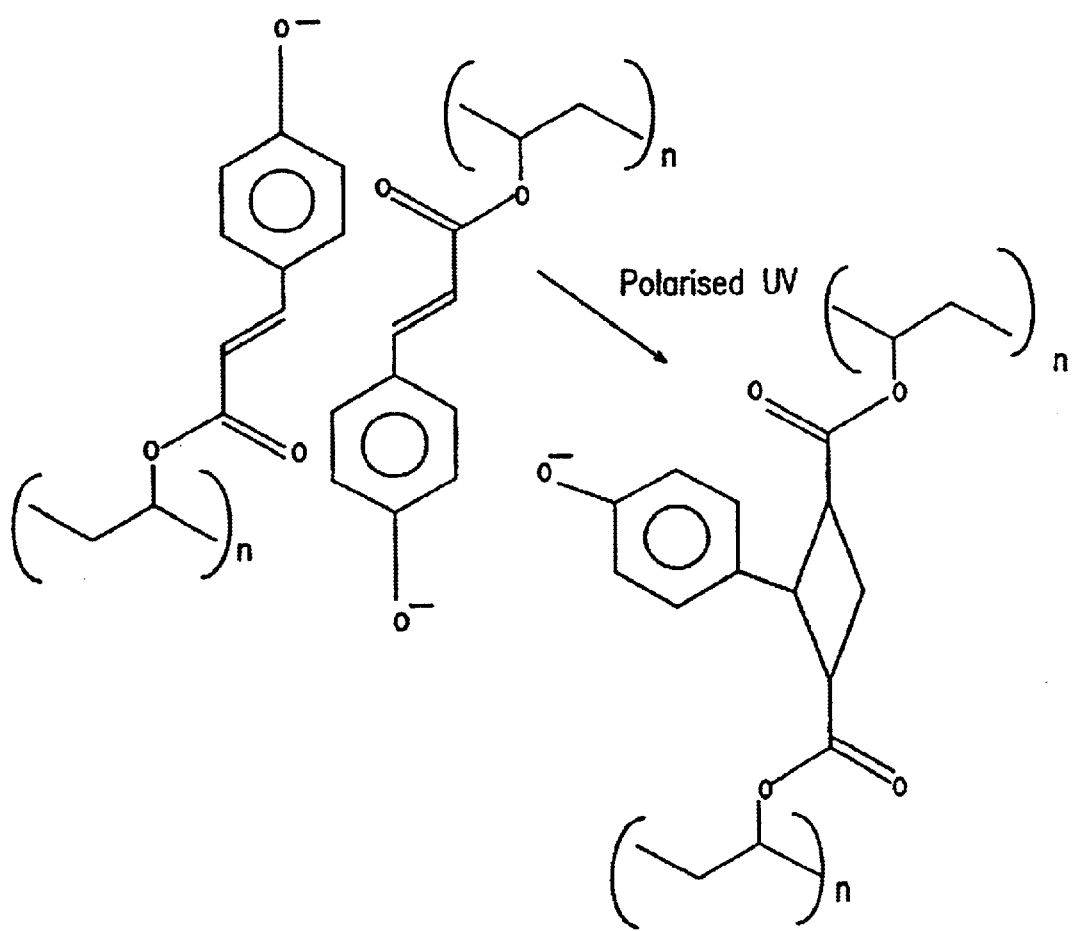
FIG. 13 is a schematic illustration of the polymerisation of a cinnamate polymer.

Another possible method that could be used is to cross-link the emitter materials using polarised UV light to give a uniform alignment direction. This is a well-known technique, and is illustrated in FIG. 13 which shows the cross linking of a cinnamate polymer under irradiation with polarised UV light.

The cross-linking of polymeric materials using polarised UV light to give a uniform alignment direction for the molecules is particularly useful for the alignment of an emitter layer in an organic EL device. These devices are often produced by sequential spin coatings of several layers of material. In this case, it is Important that mutually insoluble, exclusive solvents are used for the different polymer layers in the multi-layer device.

The well-known polymeric UV cross-linkable materials are deposited on a substrate before irradiation with UV radiation. The deposition can be carried out by, for example, spinning the materials down.

An alternative method in to deposit an anisotropically emitting liquid crystal polymer or LMM layer on top of a thin UV sensitive alignment layer that has been irradiated with polarised with UV radiation. The liquid crystal polymer may be oriented at a high temperature, and this forms an oriented glass at the temperature of operation of the device. The alignment layer should have as high a conductivity as possible, and be as thin as possible, to avoid adversely affecting charge transport in the device. The UV sensitive material used for the alignment layer may be a polymer that undergoes cross-linking, or some other change, under irradiation with UV light, or it could be a LMM compound with several reactive groups that are across-linked under irradiation with UV light.

Luminescent devices that emit circularly polarised, or elliptically polarised, light can be produced by aligning the emissive molecules in an elliptical or helical configuration. This can be done, for example, by aligning the emissive molecules using a chiral liquid crystal. The use of this technique to produce circularly polarised photoluminescent devices is described by S. H. Chen et al in "Circularly Polarised Light Generated by Photo Excitation of Luminophores in Glassy Liquid-Crystal Films", in "Nature" Vol 397, p506, Feb. 11, 1999.

As an alternative to this approach, the circularly-polarised luminescent elements shown in FIG. 10 could in principle be embodied by the combination of a plane-polarised luminescent element and a $\lambda/4$ wave plate.

An electro-luminescent element which emits polarised light can also be manufactured by the method disclosed in WO 97/07654. In this method, the emitter layer consists of a mixture of a liquid crystal compound and an electroluminescent compound. The LC molecules are oriented in a preferred direction, and this orients the EL molecules in a preferred direction. An external electric or magnetic field, or a rubbed alignment layer, can be used to orient the LC molecules.

Although the present invention has been described with specific reference to electroluminescent devices, the invention to not limited to EL devices, but can be applied to other luminescent devices.

INDUSTRIAL APPLICABILITY

The present invention provides a luminescent device having first and second light-emitting regions, wherein the first light-emitting region emits, in use, a first polarised light and the second light-emitting region emits, in use, a second polarised light different from the first polarised light. A luminescent device according to this aspect of the invention can be used to produce a patterned emitter, that emits polarised light in which the nature of the emitted light varies over the area of the device. Alternatively, a device according to this aspect of the invention can be embodied as a stacked device, to overcome the problems with the prior art stacked EL devices outlined above.

What is claimed is:

1. A luminescent device having first and second light-emitting regions, wherein the first light-emitting region emits, in use, a first polarised light and the second light-emitting region emits, in use, a second polarised light different from the first polarised light.

2. A device as claimed in claim 1, wherein the first and second light-emitting regions are disposed side by side.

3. A device as claimed in claim 1, wherein the device is an electroluminescent device.

4. A device as claimed in claim 1, wherein the first light-emitting region emits, in use, light having a first polarisation and the second light-emitting region emits, in use, light having a second polarisation different from the first polarisation.

5. A device as claimed in claim 4, wherein the first and second light-emitting regions each emit, in use, plane-polarised light, and wherein the plane of polarisation of light emitted by the first light-emitting region is different from the plane of polarisation of light emitted by the second light-emitting region.

6. A device as claimed in claim 5, wherein the plane of polarisation of light emitted by the first light-emitting region is at an angle of substantially 90° to the plane of polarisation of light emitted by the second light-emitting region.

7. A device as claimed in claim 1, wherein the first light-emitting region is disposed over the second light-emitting region.

8. A device as claimed in claim 7, and further comprising a third light-emitting region, wherein the first light-emitting region is disposed over the second light-emitting region, and the second light-emitting region is disposed over the third light-emitting region.

9. A device as claimed in claim 8, wherein the third light-emitting region emits light having a third polarisation, the third polarisation being different from at least one of the first and second polarisations.

10. A device as claimed in claim 9, wherein the first second and third light-emitting regions emit plane-polarised light, the plane of polarisation of the light emitted by the second light-emitting region being at substantially 60° to the plane of polarisation of light emitted by the first light-emitting region, and the plane of polarisation of light emitted by the third light-emitting region being at substantially 120° to the plane of polarisation of light emitted by the first light-emitting region.

11. A device as claimed in claim 1, wherein the first light-emitting region emits, in use, light having a first wavelength and the second light-emitting region emits, in use, light having a second wavelength different from the first wavelength.

12. A device as claimed in claim 11, wherein the first and second light emitting regions each emit, in use, elliptically-polarised light.

13. A device as claimed in claim 11, wherein the first and second light emitting regions each emit, in use plane-polarised light.

14. A device as claimed in claim 13, wherein the plane of polarisation of light emitted by the first light-emitting region in substantially parallel to the plane of polarisation of light emitted by the second light-emitting region.

15. A device as claimed in claim 11, wherein the first and second light emitting regions each emit, in use, circularly-polarised light.

16. A device as claimed in claim 15, wherein the sense of polarisation of light emitted by the first light-emitting region is the same as the sense of polarisation of light emitted by the second light-emitting region.

17. A luminescent device having first and second light-emitting regions, wherein the emitter molecules in the first light-emitting region are aligned substantially in a first direction and the emitter molecules in the second light-emitting region are aligned substantially in a second direction, the first direction being different from the second direction.

18. A luminescent device as claimed in claim 17, wherein the first light-emitting region emits, in use, light having a different wavelength to light emitted, in use, by the second light-emitting region.

19. A luminescent device as claimed in claim 17, wherein the first light-emitting region emits, in use, light having a different polarisation to light emitted, in use, by the second light-emitting region.

20. A liquid crystal display device comprising: a layer of liquid crystal material disposed over a backlight;

wherein the backlight comprises a luminescent layer, a first portion of the luminescent layer emitting, in use, polarised light at a first wavelength and a second portion of the luminescent layer emitting, in use, polarised light at a second wavelength.

21. A liquid crystal display device as claimed in claim 20, and further comprising a first colour filter for transmitting light of the first wavelength and a second colour filter for transmitting light of the second wavelength, the first and second colour filters each being aligned with a respective one of the first and second portions of the luminescent layer.

22. A liquid crystal display device as claimed in claim 20, wherein the first and second portions of the luminescent layer emit circularly polarised light.

23. A liquid crystal display device as claimed in claim 20, wherein the luminescent layer is an electroluminescent layer.

24. A liquid crystal display device as claimed in claim 20, wherein the first and second portions of the luminescent layer emit plane polarised light.

25. A liquid crystal display device as claimed in claim 24, wherein the plane of polarisation of light emitted by the first portion of the luminescent layer is substantially parallel to the plane of polarisation of light emitted from the second portion of the luminescent layer.

* * * * *